United States Patent [19]
Ishigami

[11] Patent Number: 5,305,086
[45] Date of Patent: Apr. 19, 1994

[54] TWO STEP DEMODULATION SYNCHRONOUS DETECTOR

[75] Inventor: Motohiro Ishigami, Tokyo, Japan

[73] Assignee: Japan Aviation Electronics Industry Limited, Tokyo, Japan

[21] Appl. No.: 840,519

[22] Filed: Feb. 25, 1992

[30] Foreign Application Priority Data

Feb. 27, 1991 [JP] Japan .................................. 3-033169

[51] Int. Cl.[5] .............................................. G01C 19/72
[52] U.S. Cl. ..................................... 356/350; 329/345
[58] Field of Search ................. 356/350; 329/316, 345, 329/346

[56] References Cited

U.S. PATENT DOCUMENTS

| | | | |
|---|---|---|---|
| 4,591,269 | 5/1986 | Mohr | 356/350 |
| 5,009,480 | 4/1991 | Okada et al. | |
| 5,148,236 | 9/1992 | Blake et al. | 356/350 |

FOREIGN PATENT DOCUMENTS

| | | |
|---|---|---|
| 0418539 | 3/1991 | European Pat. Off. |
| 0057634 | 7/1990 | Japan |

*Primary Examiner*—Samuel A. Turner
*Attorney, Agent, or Firm*—Pollock, Vande Sande and Priddy

[57] ABSTRACT

In a synchronous detector a first local signal from a first local signal generator is frequency divided by a frequency divider to obtain a second local signal. The polarity of the first local signal is inverted by a polarity inverter in synchronization with the second local signal, and the output of the polarity inverter is used to synchronously detect the output of an AC amplifier by a first synchronous detector. The synchronous detected output is synchronously detected by the second local signal in a second synchronous detector, the detected output of which is averaged by a filter.

3 Claims, 4 Drawing Sheets

TWO STEP DEMODULATION SYNCHRONOUS DETECTOR

BACKGROUND OF THE INVENTION

The present invention relates to a synchronous detector which is used in a synchronous detection part of a fiber optic gyro, for example, and is particularly suitable for synchronous detection of high frequencies.

A brief description will be given first, with reference to FIG. 1, of the basic construction of an ordinary fiber optic gyro to which the present invention is applicable. Light emitted from a laser or like light source 11 is split by a beam splitter 12 into two beams, which enter, as clockwise and counterclockwise beams 14 and 15, into a loop-like optical transmission line 13 as of a plane-of-polarization retaining optical fiber coil at opposite ends thereof and propagate therethrough in opposite directions. The two 14 and 15 having thus propagated through the optical transmission line 13 and emitted therefrom are coupled again by the beam splitter 12 and interfere with each other. The resulting interference light is converted by an optoelectric transducer 16 into an electric signal corresponding to its intensity, which is cut off in DC and amplified in AC by an AC amplifier 17. An optical phase modulator 18 is provided between the beam splitter 12 and one end of the optical transmission line 13. A bias signal generator 19 applies to the optical phase modulator 18, as a modulation signal, a bias signal $V_B$ by which the phase difference between the two beams 14 and 15 at the time of their interference in the beam splitter 12 alternate between $+\pi/2$ rad and $-\pi/2$ rad at intervals of the time $\tau$ necessary for the light from the light source 11 to propagate through the optical transmission line 13. In synchronization with this phase shift the output of the AC amplifier is synchronously detected (i.e. multiplied by $\pm 1$) by a synchronous detector 21 for each time $\tau$.

The phase difference between the clockwise and counterclockwise light beams 14 and 15 when they interfere and the output of the AC amplifier 17 bear such a relationship as indicated by the curve 22 in FIG. 2. When no angular rate is being applied to the optical transmission line 13, the phase difference $\phi$ between the clockwise and counterclockwise light beams 14 and 15 is caused by their modulation with the optical phase modulator 18 to go positive and negative alternately about the zero phase by the same value at $\tau$ time intervals as indicated by the curve 23 in FIG. 2. In this instance, the output of the AC amplifier 17 becomes constant as indicated by the line 24 and the output of the synchronous detector 21 is zero. When an angular rate is applied to the optical transmission line 13, a phase difference (i.e. a Sagnac shift) $\phi_R$ develops, owing to the Sagnac effect, between the clockwise and counterclockwise light beams 14 and 15 in accordance with the direction and magnitude of the angular rate being applied. Under the influence of the Sagnac shift $\phi_R$ the phase difference $\phi$ between the beams 14 and 15 goes positive and negative alternately by the same value about a phase shifted from the zero phase by $\phi_R$ at intervals of the time $\tau$ as indicated by the curve 25 in FIG. 2. In consequence, the output of the AC amplifier 17 varies like a rectangular wave at intervals of the time $\tau$ as indicated by the curve 26 in FIG. 2. In this case, the amplitude of the output from the AC amplifier 17 corresponds to the Sagnac shift $\phi_R$ and its phase (in-phase or 180° out-of-phase) relative to the bias signal $V_B$ of the bias signal generator 19 represents the direction of the Sagnac shift. Thus the output waveform 26 of the AC amplifier 17 is detected (multiplied by +1 and −1 alternately every $\tau$ time) in synchronization with the bias signal $V_B$ and the detected output is provided as a signal representative of the magnitude and direction of the Sagnac shift $\phi_R$ between the clockwise and counterclockwise beams 14 and 15 caused by the angular rate applied to the optical transmission line 13.

The relationship between the input angular rate $\omega$ and the Sagnac shift $\phi_R$ is expressed by the following equation (1):

$$\phi_R = 4\pi R L \Omega / (\lambda C) \qquad (1)$$

where R is the radius of the optical transmission line (i.e. the optical fiber) 13, L is the length of the optical transmission line 13, $\lambda$ is the wavelength of the light emitted from the light source 11, C is the velocity of light in a vacuum, and $\Omega$ is the input angular rate.

An angular rate calculator 27 detects the magnitude of the Sagnac shift $\phi_R$ from the output of the synchronous detector 21 and calculates and outputs the input angular rate $\Omega$.

In the conventional fiber optic gyro, an offset contained in the output of the synchronous detector 21 remains intact in the results of measurement of the input angular rate, but since a typical demodulation frequency (determined by $1/(2\tau)$) is relatively high i.e., hundreds of kilohertz to several megahertz, it is difficult in the prior art to design a fiber optic gyro which affords sufficient reduction of the offset of the synchronous detector 21. Ordinary synchronous detectors as well as that for the fiber optic gyro pose the same problem, namely that a relatively large offset develops when the demodulation (i.e. detection) frequency is high.

SUMMARY OF THE INVENTION

It is therefore an object of the present invention to provide a synchronous detector which is in the offset developed by synchronous detection even if the demodulation frequency is high.

According to the present invention, a first local signal of a desired demodulation (or detection) frequency of is generated by a first local signal generator and a second local signal of a frequency lower than that of by $\frac{1}{2}$ or more. In synchronization with the second local signal, polarity-inverted and uninverted versions of the first local signal are alternately output from a polarity inverter. The output of the polarity inverter is used to synchronously detect an input signal in a first synchronous detector, the output of which is synchronously detected by the second local signal in a second synchronous detector.

BRIEF DESCRIPTION OF THE DRAWINGS

FIG. I is a block diagram showing a fiber optic gyro using a conventional synchronous detector.

DESCRIPTION OF THE PREFERRED EMBODIMENT

Figure 1:
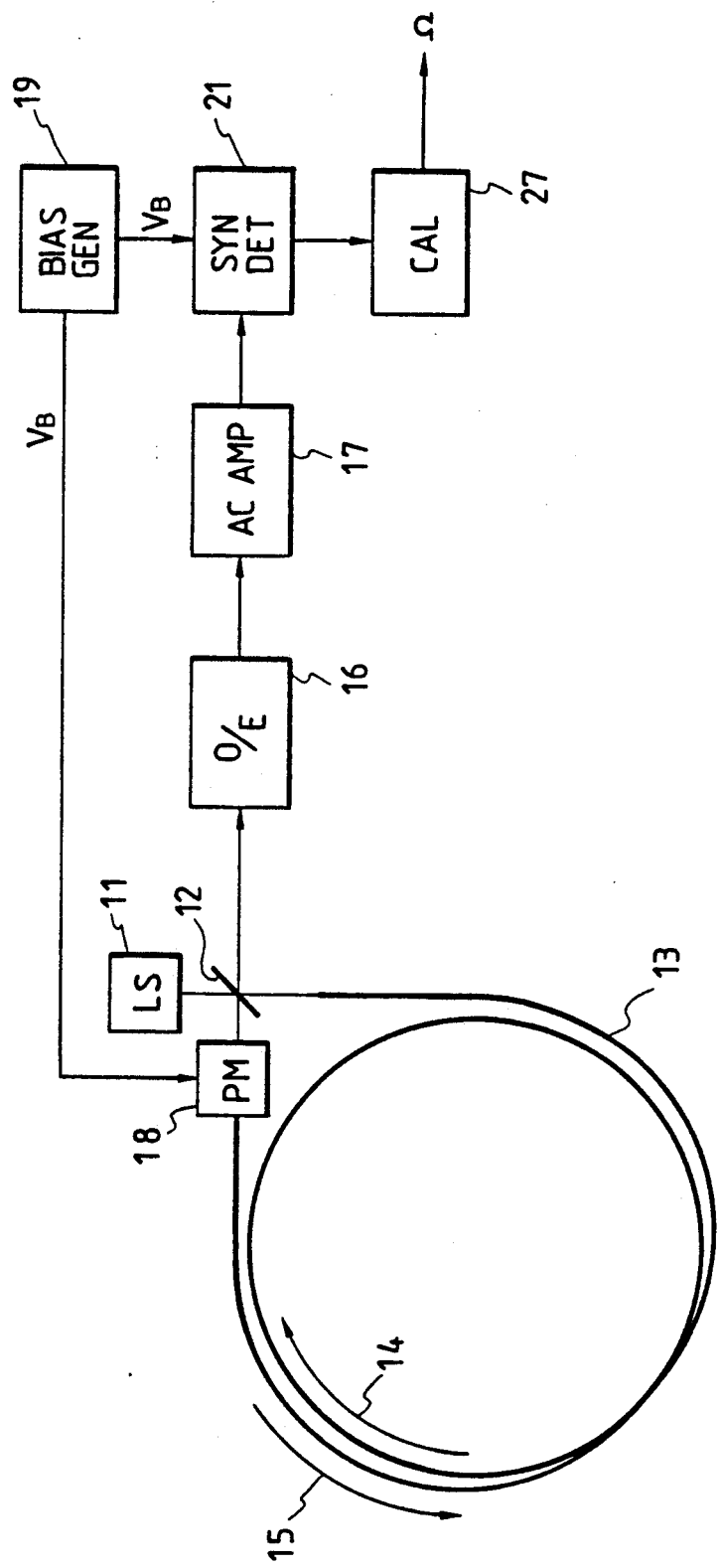
Figure 2:
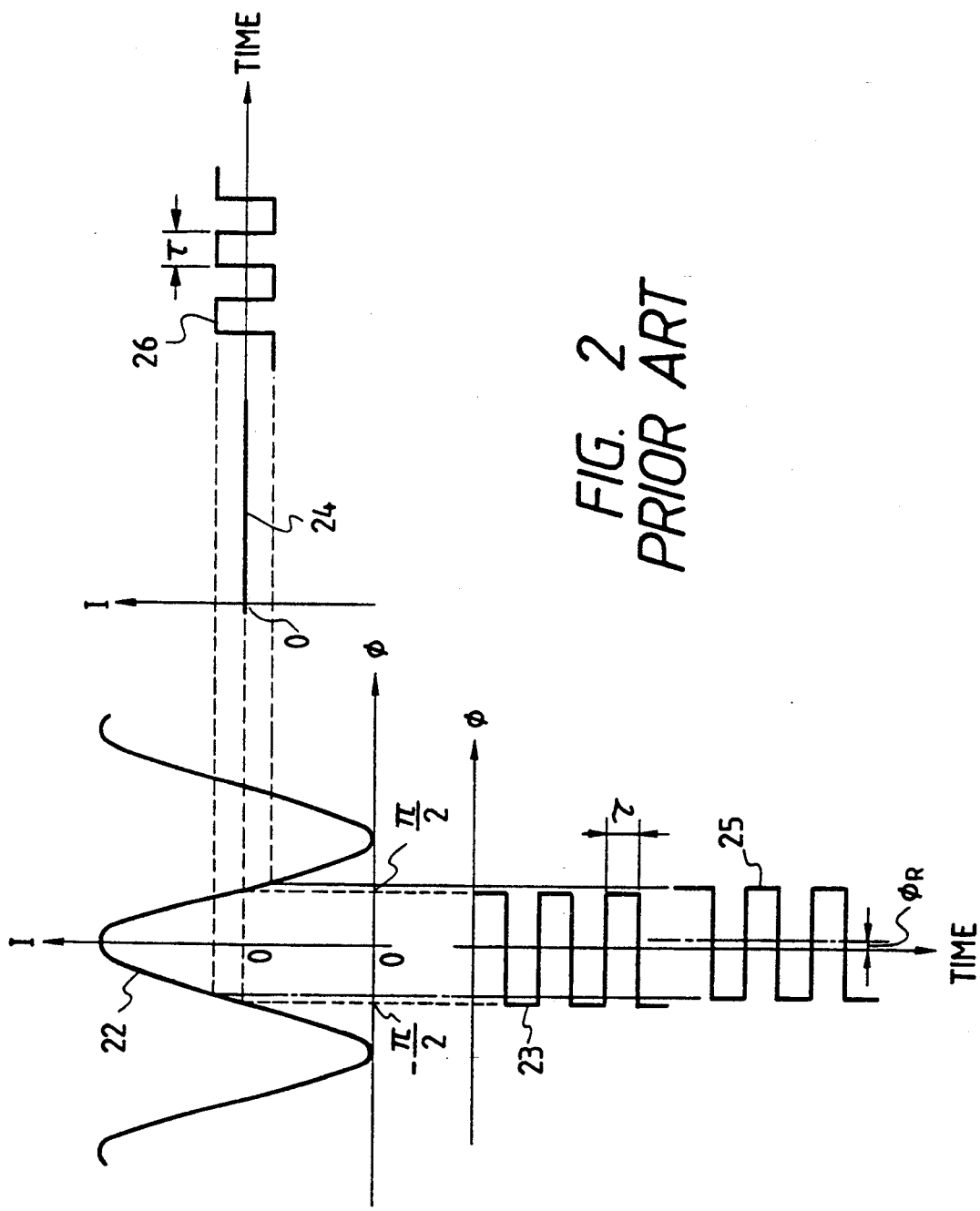
FIG. 2 is a graph showing, by way of example, an output characteristic 22 of an optoelectric transducer 16 relative to the phase difference $\phi$ between clockwise and counterclockwise light beams and variations in the output of the optoelectric transducer 16 relative to variations in the phase difference $\phi$ by a bias in the fiber optic gyro of FIG. 1.
Figure 3:
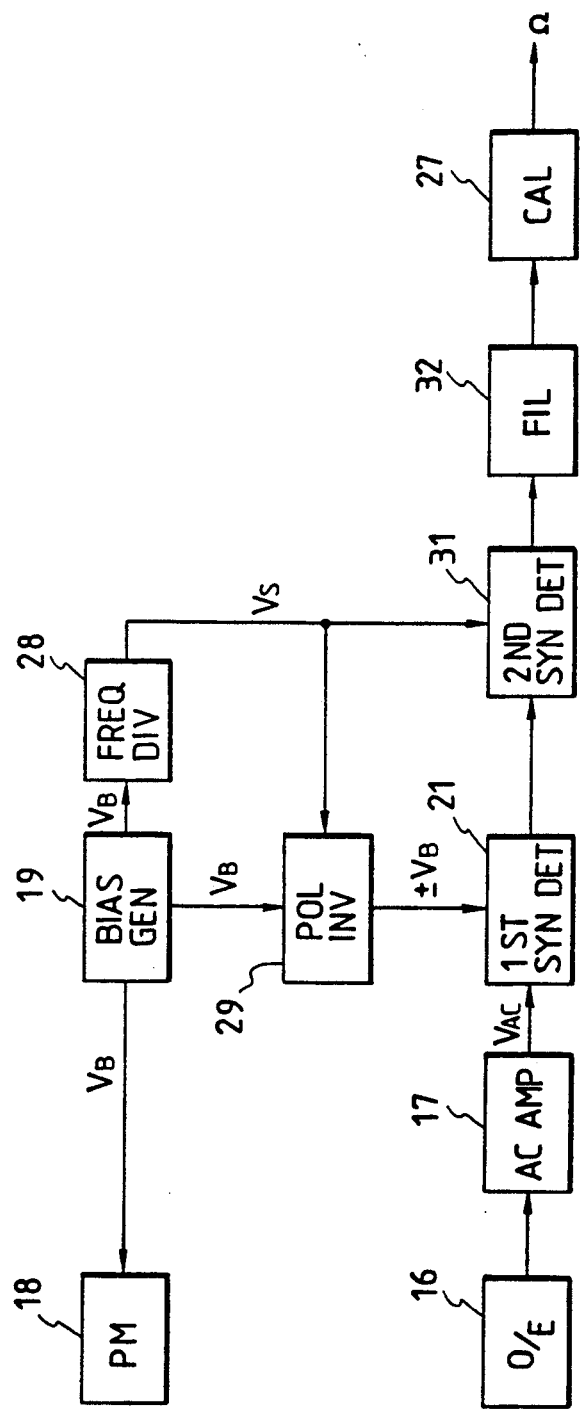
FIG. 3 is a block diagram illustrating an embodiment of the present invention applied to synchronous detection in the fiber optic gyro.
Figure 4:
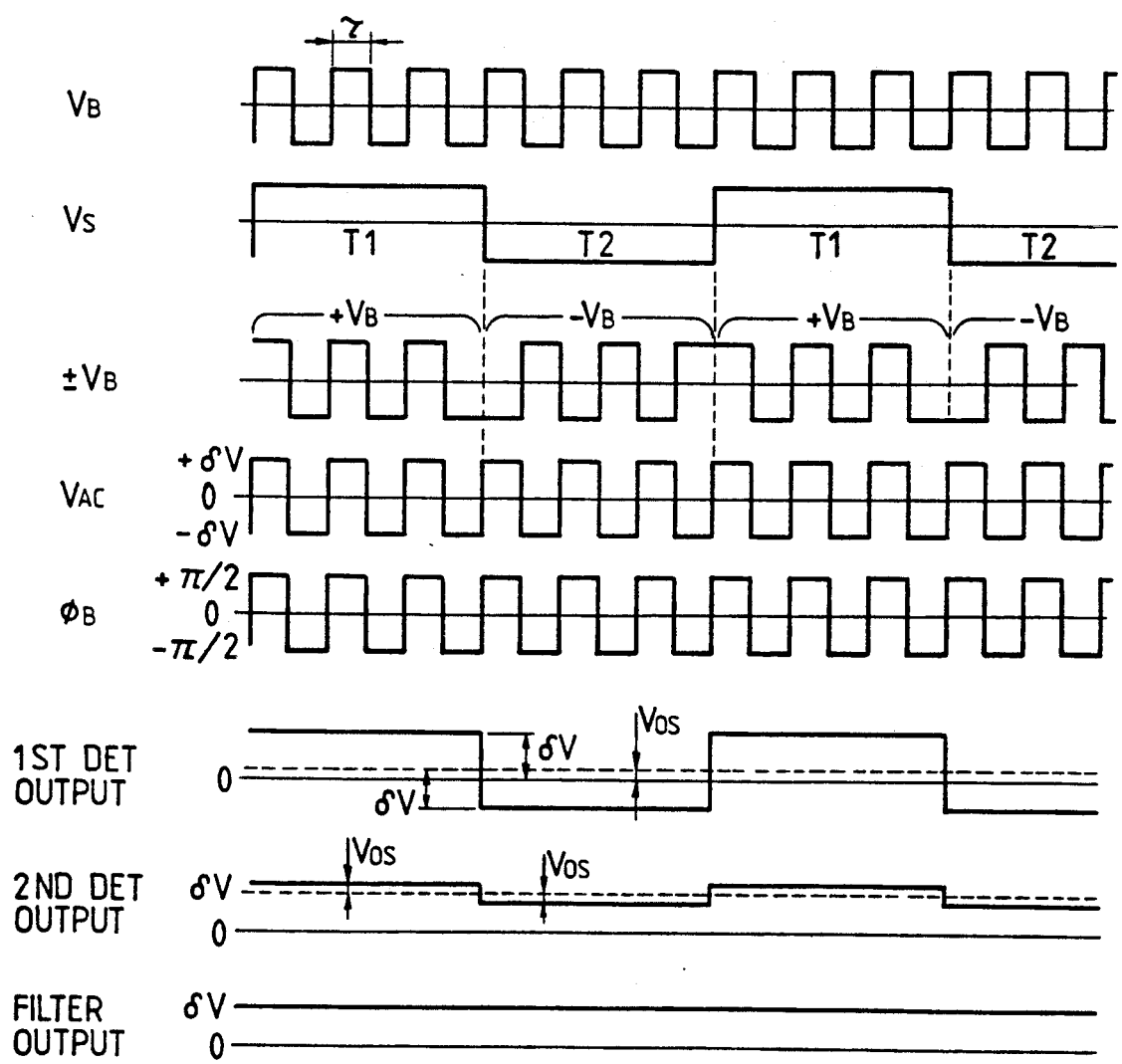
FIG. 4 is a diagram showing waveforms occurring at respective parts in FIG. 3.

FIG. 3 illustrates in block form an embodiment of the present invention applied to the synchronous detector of the fiber optic gyro, the parts corresponding to those in FIG. 1 being identified by the same reference numerals and signal waveforms occurring at respective parts in FIG. 3 being shown in FIG. 4.

The output of the optoelectric transducer 16 such as a photodiode is amplified by the AC amplifier 17, the output of which is applied as an input signal $V_{AC}$ to a first synchronous detector 21. The output $V_B$ of the bias signal generator 19, which serves as a first local signal generator, is frequency divided down to 1/N (N being an integer equal to or greater than 2) by a frequency divider 28 which serves as a second local signal generator. The bias signal $V_B$, provided as a first local signal from the bias signal generator 19, is supplied to a polarity inverter 29. The polarity inverter 29 is controlled by a second local signal $V_S$ from the second local signal generator (i.e. the frequency divider) 28 to output a polarity-inverted bias signal (indicated by $-V_B$) and a noninverted bias signal (indicated by $+V_B$) alternately with each other at $N\tau$ intervals. By the output $\pm V_B$ from the polarity inverter 29 the output $V_{AC}$ of the AC amplifier 17 is synchronously detected in the first synchronous detector 21.

As shown in FIG. 4, during the period T1 ($=N\tau$) of the first half cycle of the frequency-divided output $V_S$, the output $V_{AC}$ of the AC amplifier 17 is multiplied by $+1$ and $-1$ in synchronization with the non-inverted bias signal $+V_B$ and during the period T2 ($=N\tau$) of the second half cycle the output $V_{AC}$ of the AC amplifier 17 is multiplied by $-1$ and $+1$ in synchronization with the inverted bias signal $-V_B$.

The output of the first synchronous detector 21 is applied to the second synchronous detector 31, wherein it is synchronously detected by the second local signal $V_S$ provided from the frequency divider 28; namely, the output of the first synchronous detector 21 is multiplied by $+1$ and $-1$ in accordance with the above-mentioned periods T1 and T2. The demodulation frequency of the second synchronous detector 31 is $1/(2N\tau)$ and can be held low by selecting N large. The second synchronous detector 31 is low in its operating frequency, and hence can be designed so that its offset may be negligibly small. For example, even if a constant offset $V_{OS}$ is present in the output detected level $\delta V$ of the first synchronous detector 21 as shown in FIG. 4, the detected output $\delta V$ is polarity inverted in the periods T1 and T2 and the offset $V_{OS}$ in the output of the second synchronous detector 31 fluctuates about the detected level $\delta V$ as shown. By averaging the output of the second synchronous detector 31 in a filter 32, the offset component $V_{OS}$ in the output of the first synchronous detector 21 is cancelled, with the result that the signal component $\delta V$ representative of the Sagnac shift and an offset (not shown) of the second synchronous detector 31, which is sufficiently smaller than the offset $V_{OS}$ of the first synchronous detector 21, are output.

The output of the filter 32 is applied to an input angular rate calculator 27, wherein it is calculated as an input angular rate by Eq. (1) mentioned previously.

Although in the above the present invention has been described as being applied to the synchronous detection in an open loop type fiber optic gyro, the invention is also applicable to the synchronous detection in a closed loop type fiber optic gyro which is well-known as a serrodyne modulation system. In this fiber optic gyro the demodulation frequency $1/(2N\tau)$ is selected in the range of, for instance, several kilohertz to tens of kilohertz, taking the response speed into account. With the present invention, it is possible to reduce the offset in the detected output not only in the case of synchronous detection of the fiber optic gyro but also in the case of ordinary synchronous detection when the demodulation frequency is high. Moreover, rectangular waves are used as the first and second local signals in the above embodiment, but sine waves may also be used, and the second local signal need not always be synchronized with the first local signal but its polarity-inverted version may also be synchronized with the first local signal. In the case of applying the invention to ordinary synchronous detection, the frequency of the second local signal can be made lower, if the response speed does not matter.

As described above, according to the present invention, in the case of conducting synchronous detection at a high demodulation frequency, for example, in the range of from hundreds of kilohertz to several megahertz, even if a large offset is contained in the output of the first synchronous detector, an accurate detected output can be obtained by periodically inverting the polarity of the first local signal to be fed to the first synchronous detector, synchronously detecting the synchronously detected output of the polarity-inverted first local signal by the second synchronous detector in synchronization with the polarity inversion and then averaging the output of the second synchronous detector.

It will be apparent that many modifications and variations may be effected without departing from the scope of the novel concepts of the present invention.

What is claimed is:

1. A synchronous detector comprising:
   first local signal generating means for generating a first local signal of a frequency of;
   second local signal generating means for generating a second local signal of a frequency lower than one-half said frequency of;
   polarity inverting means for outputting polarity-inverted and non-inverted versions of said first local signal alternately in synchronization with said second local signal;
   first synchronous detecting means for synchronously detecting an input signal by the output of said polarity inverting means; and
   second synchronous detecting means for synchronously detecting the output of said first synchronous detecting means by said second local signal.

2. The synchronous detector of claim 1 wherein said second local signal generating means includes frequency dividing means for frequency dividing said first local signal down to 1/N and for providing the frequency-divided output as said second local signal, N being an integer equal to or greater than 2.

3. The synchronous detector of claim 1 or 2 further comprising filter means for averaging the output of said second synchronous detecting means.

* * * * *